US008345203B2

(12) United States Patent
Yaguchi et al.

(10) Patent No.: US 8,345,203 B2
(45) Date of Patent: Jan. 1, 2013

(54) DISPLAY DEVICE AND MANUFACTURING METHOD THEREOF

(75) Inventors: Tomio Yaguchi, Sagamihara (JP); Yasushi Nakano, Cyuo (JP); Tetsuya Nagata, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 433 days.

(21) Appl. No.: 12/626,768

(22) Filed: Nov. 27, 2009

(65) Prior Publication Data

US 2010/0126757 A1  May 27, 2010

(30) Foreign Application Priority Data

Nov. 27, 2008  (JP) ................. 2008-302852

(51) Int. Cl.
 G02F 1/1333 (2006.01)
 H01L 21/00 (2006.01)
 H05K 1/00 (2006.01)
 H05K 3/10 (2006.01)
(52) U.S. Cl. .......... 349/138; 349/158; 349/187; 438/30; 174/254; 29/846
(58) Field of Classification Search ................ 349/56, 349/60, 41, 42, 122, 138, 139, 158, 187; 438/30; 174/254; 29/846
See application file for complete search history.

(56) References Cited

U.S. PATENT DOCUMENTS

| | | | | |
|---|---|---|---|---|
| 5,516,989 A | * | 5/1996 | Uedo et al. | 174/254 |
| 5,637,834 A | * | 6/1997 | La Bate et al. | 174/264 |
| 7,164,190 B2 | * | 1/2007 | Kobashi et al. | 257/642 |
| 7,423,219 B2 | * | 9/2008 | Kawaguchi et al. | 174/254 |
| 2005/0145995 A1 | * | 7/2005 | Kobashi et al. | 257/642 |
| 2006/0208253 A1 | * | 9/2006 | Kim et al. | 257/40 |
| 2007/0138469 A1 | | 6/2007 | Yoshimoto | |
| 2009/0229876 A1 | * | 9/2009 | Takahashi | 174/378 |
| 2010/0126757 A1 | * | 5/2010 | Yaguchi et al. | 174/254 |

FOREIGN PATENT DOCUMENTS

| | | |
|---|---|---|
| JP | 2001-356370 | 12/2001 |
| JP | 2002-182587 | 6/2002 |
| JP | 2007-171314 | 7/2007 |

* cited by examiner

Primary Examiner — Brian Healy
(74) Attorney, Agent, or Firm — Antonelli, Terry, Stout & Kraus, LLP.

(57) ABSTRACT

A display device includes: a substrate; a plurality of pixels which are mounted on the substrate, each pixel including a pixel electrode; and switching elements which are mounted on the substrate, each switching element being connected to the pixel electrode. The substrate includes: a flexible insulation substrate; a first insulation layer which is formed over the insulation substrate and includes a plurality of insulation films which are spaced apart from each other, and the switching element is formed on any one of the respective insulation films. The display device can enhance flexibility thereof while forming relatively hard background films thereon.

13 Claims, 6 Drawing Sheets

DISPLAY DEVICE AND MANUFACTURING METHOD THEREOF

CROSS-REFERENCE TO RELATED APPLICATION

The present application claims priority from Japanese application JP 2008-302852 filed on Nov. 27, 2008, the content of which is hereby incorporated by reference into this application.

BACKGROUND OF THE INVENTION

Field of the Invention

The present invention relates to a display device and a manufacturing method of the display device, and more particularly to a flexible display device and a manufacturing method of the display device.

Recently, the development of flexible (bendable) display device has been extensively made. As one of methods of manufacturing a flexible display device, there has been proposed a method which directly forms a TFT array on a bendable resin substrate. However, the resin substrate has difficulty in heat resistance and hence, it is difficult to apply a TFT array forming process using a glass substrate to a resin substrate. Accordingly, there has been proposed a method which manufactures a flexible display device by a so-called transfer technique in which a TFT array is formed on a glass substrate having high heat resistance and, thereafter, the glass substrate is removed or a thin glass film is left and the TFT array is adhered to a resin substrate. On the resin substrate to which the TFT array is adhered, a background film which is formed on a glass substrate using silicon nitride or silicon oxide and a circuit which is formed on the background film and includes switching elements such as thin film transistors are arranged.

SUMMARY OF THE INVENTION

The background film which is formed on the glass substrate and is transferred to a substrate having flexibility such as a resin substrate is formed of a dense hard film for preventing contamination from the glass substrate in general. Accordingly, cracks are liable to occur in the background film due to the deformation of the plastic substrate and hence, the enhancement of flexibility is limited.

The present invention has been made under such circumstances, and it is an object of the present invention to enhance flexibility of a display device in which a background film is formed on a substrate having flexibility.

To briefly explain the summary of typical inventions among inventions disclosed in this specification, they are as follows.

According to one aspect of the present invention, there is provided a display device which includes: a substrate; a plurality of pixels which are mounted on the substrate, each pixel including a pixel electrode; and switching elements which are mounted on the substrate, each switching element being connected to the pixel electrode, wherein the substrate includes: a flexible insulation substrate; and a first insulation layer which is formed over the insulation substrate and includes a plurality of insulation films which are spaced apart from each other, and the switching element is formed on any one of the respective insulation films.

In one mode of the present invention having the above-mentioned constitution, each insulation film may contain silicon nitride or silicon oxide.

In another mode of the present invention having the above-mentioned constitution, the switching element may be a thin film transistor.

In still another mode of the present invention having the above-mentioned constitution, each insulation film may be formed corresponding to each switching element.

In still another mode of the present invention having the above-mentioned constitution, the plurality of switching elements may be formed on at least one insulation film.

In still another mode of the present invention having the above-mentioned constitution, the plurality of switching elements which are arranged in a row in the predetermined direction may be formed on at least one insulation film.

In still another mode of the present invention having the above-mentioned constitution, side walls of each insulation film may be formed in a tapered shape which expands in the direction toward the insulation substrate.

In still another mode of the present invention having the above-mentioned constitution, an electrode which is connected to the switching element may be formed on each insulation film, and a line which is connected to the electrode may be arranged between the plurality of insulation films.

In still another mode of the present invention having the above-mentioned constitution, the line may be formed of an organic conductive film.

In still another mode of the present invention having the above-mentioned constitution, the line may be formed of a thin metal film.

In still another mode of the present invention having the above-mentioned constitution, an organic leveling film may be formed below the line.

According to another aspect of the present invention, there is provided a manufacturing method of a display device which includes the steps of: forming an insulation layer on a glass substrate; forming a plurality of insulation films which are spaced apart from each other by patterning the insulation layer; forming a plurality of switching elements which are respectively formed on any one of the respective insulation films; removing or thinning the glass substrate; and adhering the insulation layer and the switching elements to an insulation substrate having flexibility.

According to the present invention, it is possible to enhance flexibility of the display device in which the background film is formed on the substrate having flexibility.

DESCRIPTION OF THE PREFERRED EMBODIMENTS

Hereinafter, an embodiment of the present invention is explained in detail in conjunction with drawings. A display device according to this embodiment is a TN (Twisted Nematic)-type liquid crystal display device. The display device includes a TFT array substrate, a color filter substrate which faces the TFT array substrate in an opposed manner and mounts color filters and a counter electrode thereon, and a liquid crystal material sealed in a region sandwiched by both substrates. Both the TFT array substrate and the color filter substrate are formed of a flexible (bendable) resin substrate.

Figure 1:
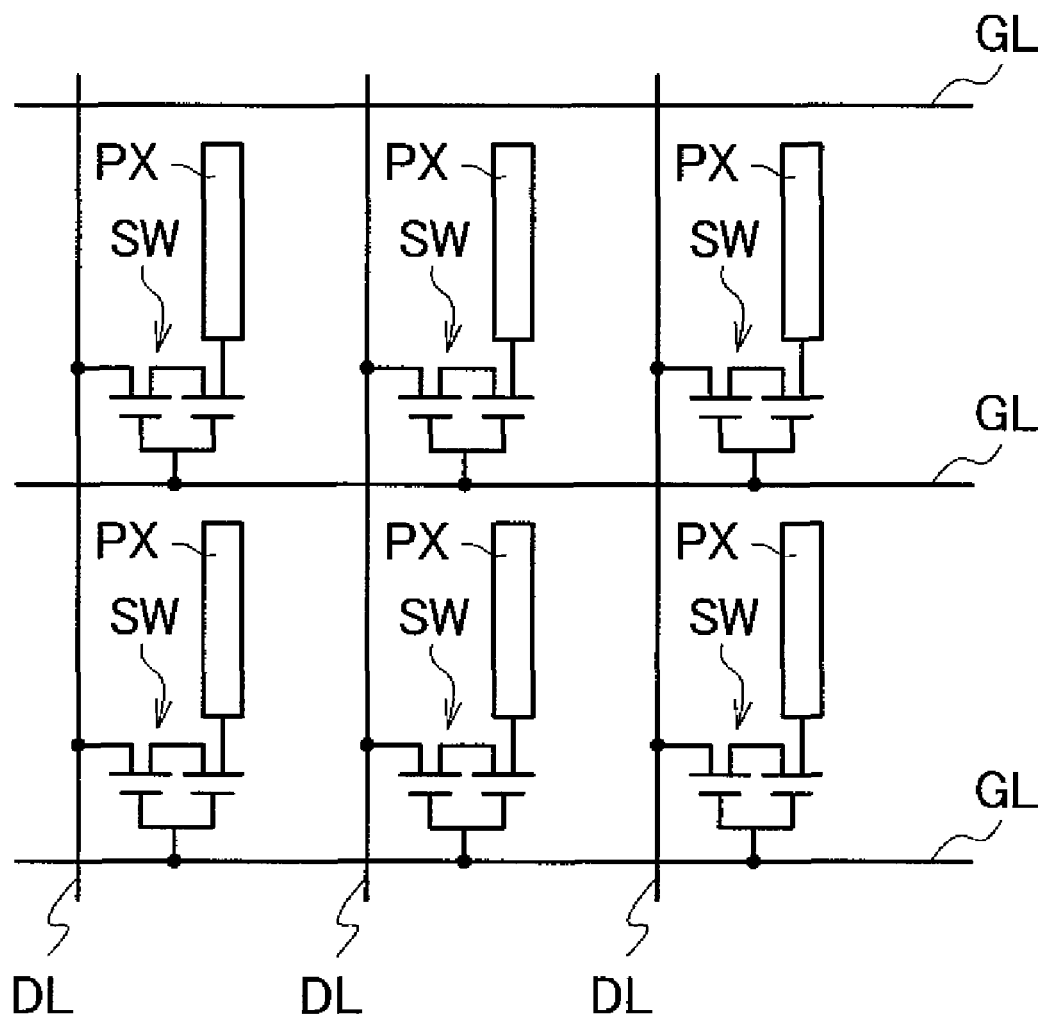
FIG. 1 is a circuit diagram showing an equivalent circuit of a display device according to an embodiment of the present invention.

FIG. 1 is a circuit diagram showing an equivalent circuit of a display region portion of a display device according to the embodiment of the present invention. In a display region of an array substrate, a large number of gate signal lines GL are arranged parallel to each other and extend in the lateral direction, and ends of these gate signal lines GL are connected to a gate signal line drive circuit not shown in the drawing. Further, a large number of video signal lines DL are also arranged parallel to each other and extend in the longitudinal direction, and ends of the video signal lines DL are connected to a video signal line drive circuit not shown in the drawing. The display region is partitioned or defined in a matrix array by these gate signal lines GL and the video signal lines DL, and each defined region constitutes one pixel region. Each pixel region corresponds to a pixel to be displayed, and a pixel circuit is formed in the pixel region. Although only six pixel circuits are shown in the drawing, in an actual display device, pixel circuits the number of which is three times as large as the number of pixels to be displayed are arranged. The reason that the number of pixel circuits is three times as large as the number of pixels to be displayed is that the pixel circuit is provided for respective sub pixels of RGB.

A switching element SW is arranged corresponding to each portion where the gate signal line GL and the video signal line DL intersect with each other. The switching element SW is a thin film transistor having the so-called multi-gate structure. In the switching element SW, gate electrodes of two transistors are connected to each other thus forming a gate electrode of the switching element SW, a source electrode of one transistor and a drain electrode of the other transistor are connected to each other, and an unconnected source electrode and an unconnected drain electrode constitute a source electrode and a drain electrode of the switching element SW respectively. The gate electrode of the switching element SW is connected to the gate signal line GL, and the drain electrode of the switching element SW is connected to the video signal line DL. A pixel electrode PX is formed in each pixel circuit, and the pixel electrode PX is connected to a source electrode of the switching element SW. In a liquid crystal display device, polarities of voltages applied to the source electrode and the drain electrode of the switching element SW is suitably inverted depending on a drive method. Accordingly, although the source electrode and the drain electrode of the switching element SW are determined based on polarities of applied voltages, for the sake of convenience, the source electrode and the drain electrode are determined based on their connection destinations in this specification.

In the circuit constitution described above, a reference voltage is applied to the counter electrode formed on the color filter substrate, and a gate voltage is applied to the gate signal line GL thus selecting a pixel row. Further, a video signal is supplied to each video signal line DL at such selection timing so that a voltage of a video signal is applied to the pixel electrode PX of each pixel. Due to such application of voltages, a vertical electric field having intensity corresponding to the voltage of the video signal is generated between the pixel electrode PX and the counter electrode, and the alignment of liquid crystal molecules is determined corresponding to the intensity of the electric field.

Figure 2:
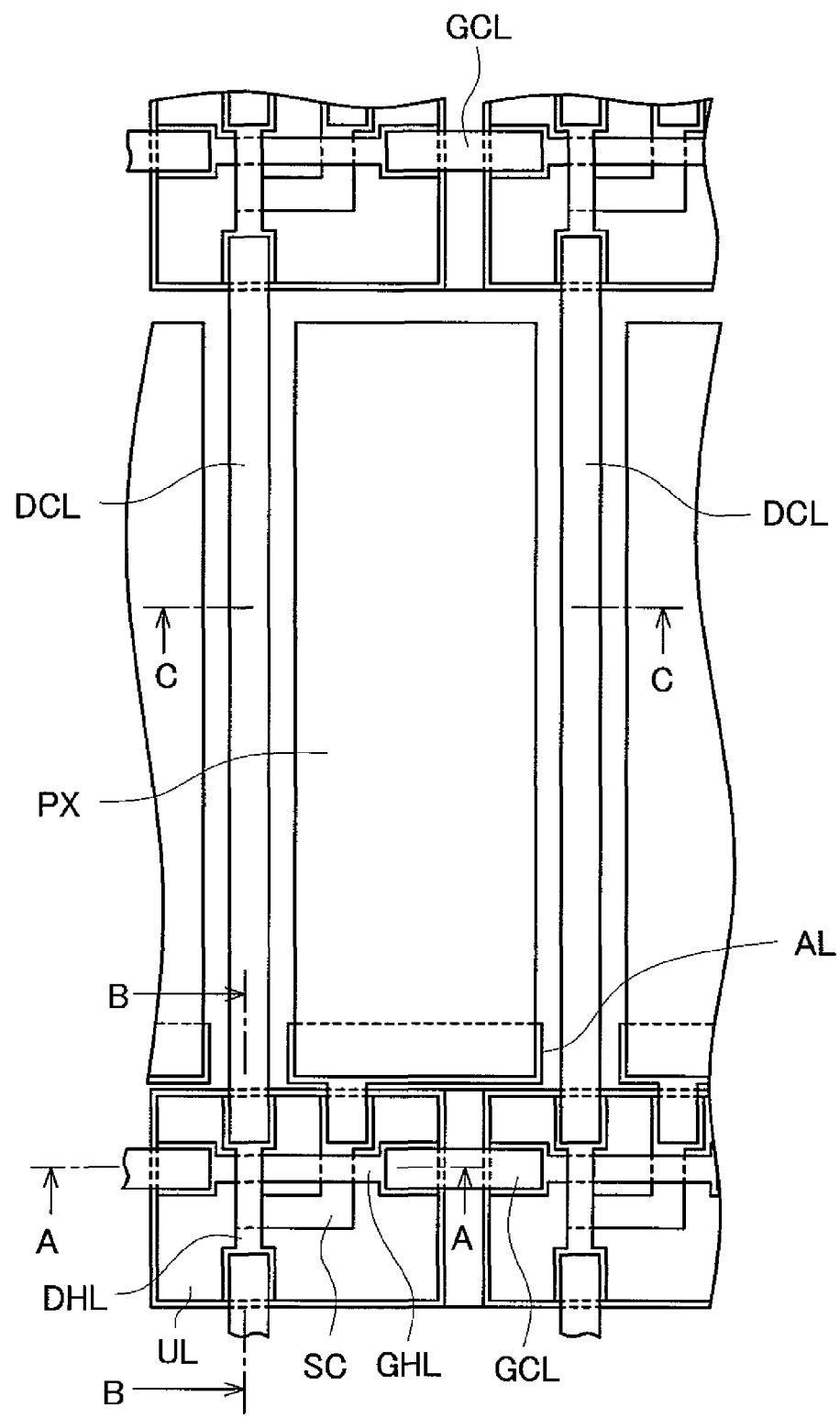
FIG. 2 is a plan view showing one example of a pixel circuit portion of a TFT array substrate according to the embodiment.

FIG. 2 is a partial plan view showing one example of a pixel circuit portion of the TFT array substrate according to this embodiment. In the drawing, for facilitating the explanation of the pixel circuit portion, the pixel circuit portion is explained by mainly focusing on layers having conductivity, and each insulation layer which is interposed between these conductive layers is not shown. Further, the drawing shows one pixel circuit out of the pixel circuits which are arranged parallel to each other in the lateral direction as well as in the longitudinal direction, and a portion of each of the pixel circuits arranged adjacent to such one pixel circuit.

The rectangular pixel electrode PX is arranged at a center portion of the drawing. The pixel electrode PX having the same shape is arranged also on left and right sides of such a pixel electrode PX with a fixed distance therebetween. Although not shown in the drawing, the pixel electrode PX having the same shape is arranged also on upper and lower sides of such a pixel electrode PX with a fixed distance therebetween. An island-shaped and rectangular background film UL is provided on a left lower side of the pixel electrode PX arranged at the center portion of the drawing corresponding to the pixel electrode PX. Here, the background film is a film made of silicon nitride or the like and having insulation property which is arranged between a resin substrate SBF (formed on a glass substrate during the manufacture) and the switching element SW. This background film is formed for preventing impurities contained in the glass substrate which constitutes a lower layer at the time of forming thin film transistors and the like on the glass substrate from contaminating the thin film transistors and the like. Particularly, when a thin film transistor formed by using polycrystalline silicon is used as the switching element SW, characteristics of a channel of the transistor are changed due to such contamination and hence, the provision of the background film is inevitable.

On left and right sides of the above-mentioned background film UL, the background films UL which are spaced apart from the above-mentioned background film UL and respectively correspond to the left and right pixel electrodes PX are provided. Further, also on a left upper side and a right upper side of the pixel electrode PX arranged at the center portion of the drawing, the background films UL are provided corresponding to the pixel electrodes PX not shown in the drawing which are arranged above the pixel electrode PX arranged at the center portion of the drawing. A video signal connection line DCL extends in the vertical direction between the pixel electrode PX arranged at the center portion of the drawing and the pixel electrode PX arranged on a left side of such a pixel electrode PX, and the video signal connection line DCL reaches an upper edge portion of the background film UL arranged on a left lower side of the drawing and a lower edge portion of the background film UL arranged on a left upper portion of the drawing. In the same manner, a video signal connection line DCL extends in the vertical direction in a region sandwiched between the pixel electrode PX arranged at the center portion of the drawing and the pixel electrode PX arranged on a right side of such a pixel electrode PX, and the video signal connection line DCL reaches an upper edge portion of the background film UL arranged on a right lower side of the drawing and a lower edge portion of the background film UL arranged on a right upper portion of the drawing.

The structure of the background film UL and a circuit formed on the background film UL is explained hereinafter. On the upper edge portion of the background film UL, two terminals are arranged for one background film UL, wherein the left terminal is connected to one of the above-mentioned video signal connection lines DCL, and the right terminal is connected to a metal film AL made of aluminum or an aluminum alloy, for example. The metal film AL is formed so as to overlap with a lower edge portion of the pixel electrode PX in plane, and is connected to the pixel electrode PX via a contact hole not shown in the drawing. Accordingly, the metal film AL electrically connects the switching element SW and the pixel electrode PX with each other. Here, the left terminal constitutes an upper end portion of the video signal line DHL which extends in the vertical direction on the background film UL. A lower end portion of the video signal line DHL also constitutes a terminal and is connected to another video signal connection line DCL. A gate signal line GHL extends in the lateral direction slightly above the center of the background film UL. A right end of the gate signal line GHL constitutes a terminal, and is connected to a gate connection line GCL. The gate connection line GCL is connected to another gate signal line GHL at a left edge portion of the background film UL arranged adjacent to the above-mentioned background film UL on a right side. Further, a left end of the gate signal line GHL (a portion of the left edge of the background film UL) also constitutes a terminal, and another gate connection line GCL is connected to the left end of the gate signal line GHL.

The right terminal arranged on a right side of an upper edge portion of the background film UL constitutes a portion of a semiconductor film SC, and the semiconductor film SC extends in a strip shape. The semiconductor film SC extends downwardly from the terminal thereof, intersects with the gate signal line GHL below gate signal line GHL and, thereafter, is bent in the left direction in the drawing and advances straightly. Then, the semiconductor film SC is directed upwardly below the video signal line DHL, advances straightly in such a manner that the semiconductor film SC is concealed by the video signal line DHL in plane, intersects with the gate signal line GHL below the gate signal line GHL and, further, extends to and reaches an upper edge portion of the background film UL. The semiconductor film SC has an upper end portion thereof connected to a terminal portion of the video signal line DHL. The semiconductor film SC is mainly formed using polycrystalline silicon (p-Si) or microcrystalline silicon (pc-Si), for example. Here, microcrystalline silicon is crystalline silicon whose crystal grain size falls within a range from approximately 10 nm to 100 nm. Polycrystalline silicon is one kind of crystalline silicon. The semiconductor film SC may be formed using amorphous silicon (a-Si).

Here, the gate signal line GHL, the semiconductor film SC, a metal portion on the upper end of the video signal line DHL and the metal film AL constitute the switching element SW formed of a double-gate-type thin film transistor. The thin film transistor used in this embodiment is a top-gate-type transistor. A portion of the gate signal line GHL which overlaps with the semiconductor film SC constitutes a gate electrode of the switching element SW (thin film transistor), a portion where the semiconductor film SC and the video signal line DHL are connected to each other constitutes a drain electrode of the switching element SW, and a portion where the semiconductor film SC and the metal film AL are connected to each other constitutes a source electrode of the switching element SW. In the drawing, the gate signal line GHL and the gate connection line GCL correspond to the gate signal line GL shown in FIG. 1, and the video signal line DHL and the video signal connection line DCL correspond to the video signal line DL shown in FIG. 1.

Figure 3:
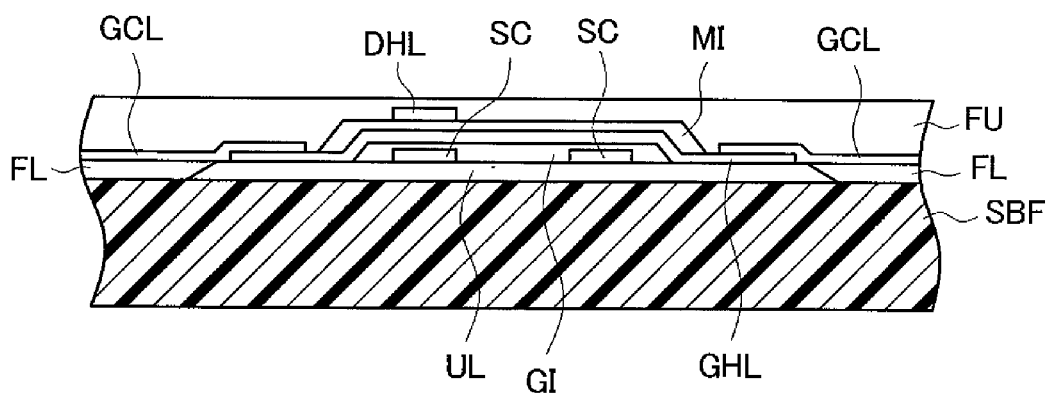
FIG. 3 is a cross-sectional view taken along a line A-A in FIG. 2.
Figure 4:
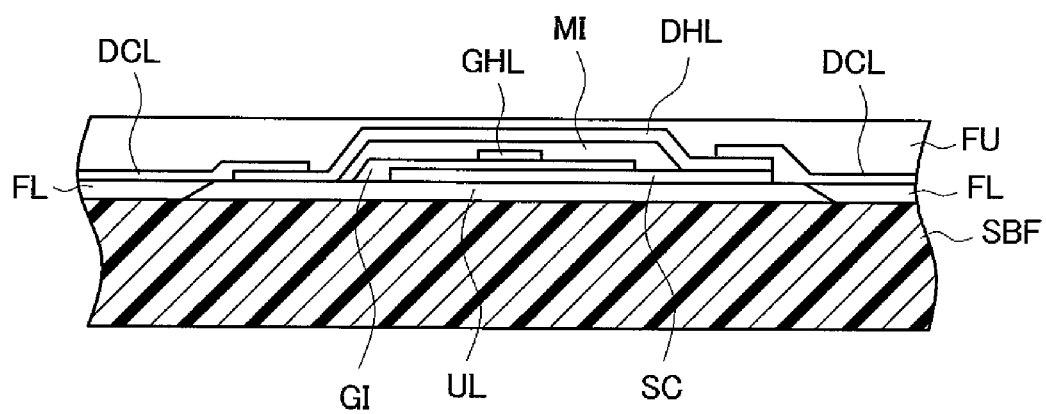
FIG. 4 is a cross-sectional view taken along a line B-B in FIG. 2.

Next, the layer structure of the TFT array substrate according to this embodiment in the vicinity of the background film UL is explained in conjunction with FIG. 3 and FIG. 4. FIG. 3 is a cross-sectional view taken along a line A-A in FIG. 2, and FIG. 4 is a cross-sectional view taken along a line B-B in FIG. 2. Layers including a plurality of background films UL are formed above a resin substrate SBF having flexibility and insulation property. Side walls of the background film UL have a projecting shape where the side wall gradually increases a projection amount from an upper side to a lower side thereof (forward tapered shape). A lower leveling film FL containing an organic resin is formed in a region of the resin substrate SBF where the background film UL is not formed. A stepped portion between a peripheral portion of the background film UL and the resin substrate SBF is compensated by the lower leveling film FL. The semiconductor film SC is formed on the background film UL. Above the semiconductor film SC, the gate signal line GHL which extends from an area above a right edge to an area above a left edge of the background film UL as viewed in FIG. 3 is formed. A gate insulation film GI is formed between the gate signal line GHL and the semiconductor film SC. The gate insulation film GI is formed only in the vicinity of a center portion of the background film UL and covers the semiconductor film SC except for areas in the vicinity of the terminal portions of the semiconductor film SC. The gate insulation film GI is provided for separating the semiconductor film SC and the gate signal line GHL from each other.

At terminal portions on left and right edges of the background film UL shown in FIG. 3 where the gate insulation film GI is not formed, the gate signal line GHL has an upper surface thereof connected to the gate connection line GCL. The gate connection lines GCL are formed on an upper surface of the lower leveling film in a contacting manner, and extend in the left and right directions in FIG. 3 respectively. An interlayer insulation film MI is formed so as to cover the gate insulation film GI and the gate signal line GHL. The interlayer insulation film MI is formed only in the vicinity of the center portion of the background film UL, and is not formed in peripheral portions of the background film UL where the terminals are formed. On the interlayer insulation film MI, the video signal line DHL which extends from an area above a right edge to an area above a left edge of the background film UL as viewed in FIG. 4 is formed. At terminal portions on left and right edges of the background film UL shown in FIG. 4, the video signal line DHL has an upper surface thereof connected to the video signal connection line DCL. The video signal connection lines DCL are formed on an upper surface of the lower leveling film in a contacting manner, and extend in the left and right directions in FIG. 4 respectively. Further, at the terminal portion on a right edge of the background film UL in FIG. 4 (at the terminal on a right side of an upper edge of the background film UL in FIG. 2), the semiconductor film SC is brought into contact with the video signal line DHL in an overlapping manner with the video signal line DHL from below thus establishing an electrical connection between the video signal line DHL and the semiconductor film SC. An upper leveling film FU containing an organic resin is formed above the above-mentioned structure irrespective of whether the upper leveling film FU overlaps with the background film UL in plane or not, and an upper surface of the upper leveling film FU is made flat.

Figure 5:
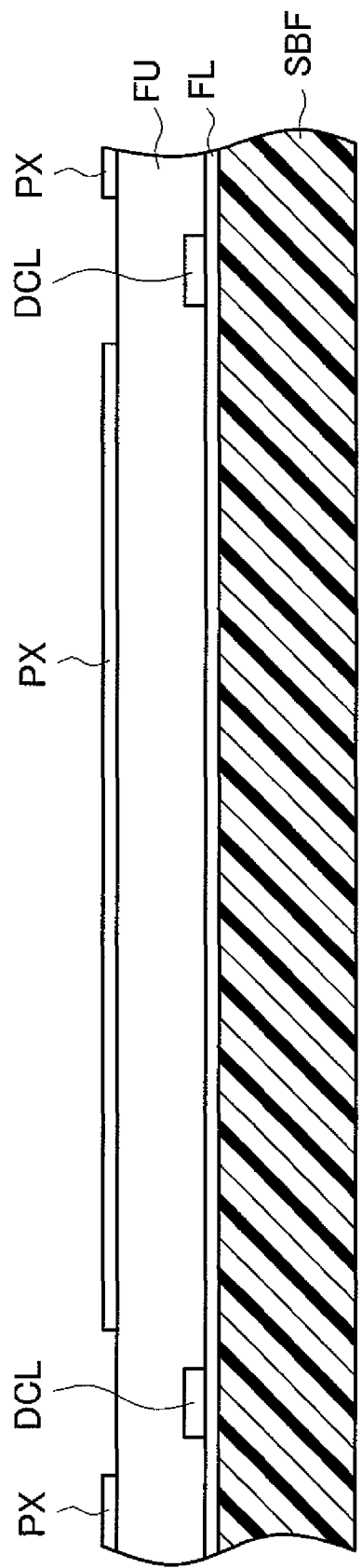
FIG. 5 is a cross-sectional view taken along a line C-C in FIG. 2.

Next, the layer structure of the TFT array substrate according to this embodiment in the vicinity of the pixel electrode PX is explained in conjunction with FIG. 5. FIG. 5 is a cross-sectional view taken along a line C-C in FIG. 2. The lower leveling film FL is formed on the resin substrate SBF, and the video signal connection lines DCL are formed on the lower leveling film FL. The upper leveling film FU is formed over the lower leveling film FL and the video signal connection lines DCL, and an upper surface of the upper leveling film FU is made flat. The pixel electrodes PX formed of a transparent electrode are formed on the upper leveling film FU. The pixel electrodes PX are formed at a low temperature using ITO (Indium Tin Oxide), for example. The pixel electrodes PX are formed such that the pixel electrodes PX do not overlap with the video signal connection lines DCL, and the gate connection lines GCL and the background substrate UL not shown in the drawing as viewed in a plan view. Further, an alignment film not shown in the drawing is formed above the pixel electrodes PX.

By providing the hardest background film UL in a separated manner as described above, it is possible to prevent the occurrence of cracks which may take place in the background film UL when the substrate of the display device is deformed or bent due to the application of an external force. This is because that a part which is deformed is not the background film UL but a region around the background film UL which is relatively soft. Accordingly, it is possible to prevent disconnection of a line caused by cracks thus enhancing flexibility of the display device. Further, by forming the side walls of the background film UL in a forward tapered shape, it is possible to suppress the disconnection of the gate connection line GCL or the video signal connection line DCL. Further, with the provision of the lower leveling film FL, the stepped portion at the peripheral portion of the background film UL can be reduced thus eventually suppressing the disconnection of the gate connection line GCL or the video signal connection line DCL. The formation of the lower leveling film FL is not inevitable and hence, it may be possible to adopt the structure having no such a film. Although not shown in FIG. 3 and FIG. 4, an inorganic protective layer may be formed above the video signal line DHL and below the upper leveling film FU. The inorganic protective layer may be formed using silicon nitride, for example, and may be formed on the background film UL in an overlapping manner in plane such that the inorganic protective layer covers the video signal line DHL and the interlayer insulation film MI.

Figure 6A:
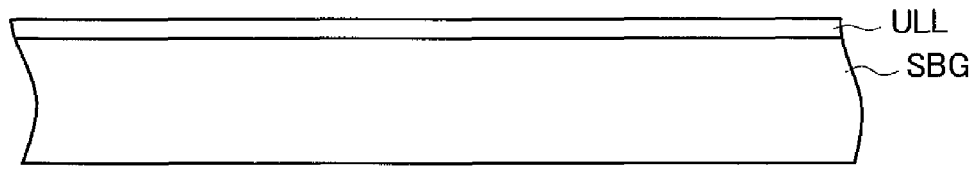
FIG. 6A to 6D are views showing manufacturing steps of the TFT array substrate according to the embodiment.
Figure 6B:
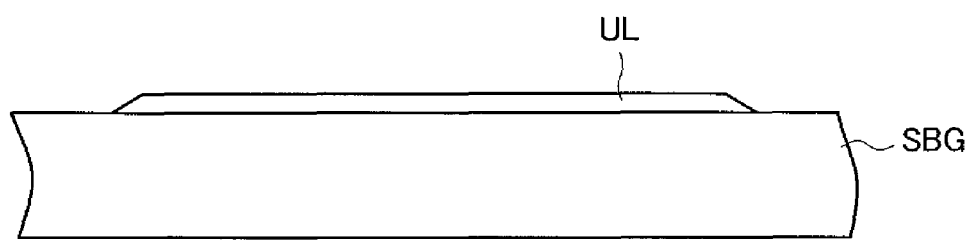

FIG. 6A to 6D are views showing manufacturing steps of the TFT array substrate according to this embodiment. Firstly, a background layer ULL for forming the background films UL is formed on the glass substrate SBG by a CVD method or the like using silicon nitride, for example (FIG. 6A). Next, the background layer ULL is patterned by photolithography and etching (FIG. 6B) thus forming a plurality of background films UL which are spaced apart from each other. Here, for forming an edge portion of the background film UL in a forward tapered shape, the background film UL may be etched plural times using a halftone masks, for example. To be more specific, photolithography, etching and ashing are sequentially performed in a state that a thickness of a resist in a region corresponding to the edge of the background film UL becomes smaller than a thickness of a resist in a region corresponding to portions other than the edge of the background film UL thus making the thicknesses of edges of the background film UL thin by etching whereby the background films UL having a forward tapered shape can be formed.

Next, a semiconductor layer is formed on the glass substrate SBG on which the background films UL are formed. To be more specific, the semiconductor layer is formed such that an amorphous silicon film is formed by a CVD method, dehydration or the like is applied to the amorphous silicon film and, thereafter, amorphous silicon is crystallized into polycrystalline silicon by laser annealing such as annealing using an excimer laser or the like. The semiconductor layer is formed into semiconductor films SC having a shape shown in FIG. 2, FIG. 3 and the like by way of a known lithography step and a known etching step. Impurities such as phosphorous (P) are implanted into the semiconductor film SC thus forming a channel region or the like of a thin film transistor. Next, the gate insulation film GI is formed so as to cover the semiconductor film SC. The gate insulation film GI is formed by a CVD method or the like using silicon dioxide ($SiO_2$), for example. The gate insulation film GI is patterned by photolithography and etching such that the gate insulation film GI is not present on a peripheral portion of the background film UL and a region of the glass substrate SBG where the background film UL is not formed.

Next, a film is formed using metal for forming the gate signal lines GHL, for example, high-melting-point metal such as molybdenum, tungsten or tantalum or an alloy of these metals, and the film is patterned by photolithography and etching thus forming the gate signal lines GHL. The interlayer insulation film MI is formed so as to cover the gate signal lines GHL and the gate insulation film GI. The interlayer insulation film MI is formed such that a film is formed by a CVD method or the like using silicon dioxide ($SiO_2$), for example, and the film is patterned by photolithography and etching. Then, the video signal lines DHL are formed on the interlayer insulation film MI. To be more specific, a film is formed using metal for forming the video signal lines DHL, for example, high-melting-point metal such as molybdenum, tungsten or tantalum or an alloy of these metals, and the film is patterned by photolithography and etching thus forming the video signal lines DHL.

Next, the lower leveling film FL is formed. To be more specific, for example, a photosensitive organic resin film is formed by coating such that a thickness of the organic resin film becomes substantially equal to a thickness of the background film UL formed finally, and photolithography is applied to the organic resin film so as to remove the organic resin film above the background film UL. Next, the gate connection lines GCL and the video signal connection lines DCL are formed. To be more specific, the gate connection lines GCL and the video signal connection lines DCL may be formed by applying an organic conductive film, for example, or by forming a flexible thin metal film and by patterning the organic conductive film or the thin metal film. The upper leveling film FU is formed on the gate connection lines GCL and the video signal connection lines DCL. To be more specific, for forming contact holes which connect the pixel electrodes PX and the metal films AL, for example, it is preferable that a photosensitive organic resin film is applied and photolithography is applied to the organic resin film. Next, the pixel electrodes PX are formed on the upper leveling film FU. To be more specific, the pixel electrodes PX are formed by forming a film made of ITO at a low temperature and by patterning the film.

Figure 6C:
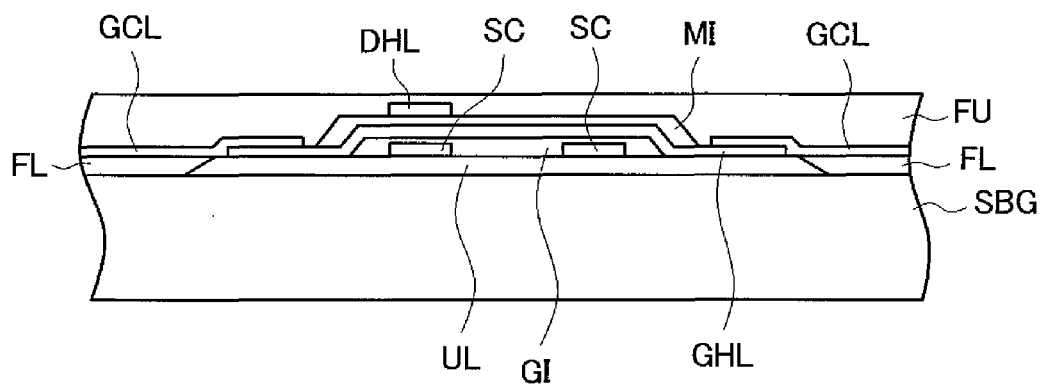

Due to the above-mentioned steps, on the glass substrate SBG, the background films UL and the circuits which include the switching elements SW formed on the background films UL, and the flexible circuits which include the pixel electrodes PX formed between the background films UL, the gate connection lines GCL, the video signal connection lines DCL and the like are formed (FIG. 6C). In steps which are performed following the above-mentioned steps, so-called transfer in which the background films UL, the above-mentioned circuits and the like which are formed on the glass substrate SBG are transferred to the resin substrate SBF is performed.

Figure 6D:
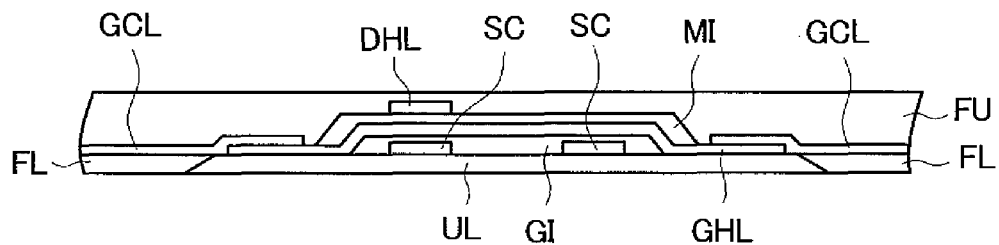

In the transfer steps, firstly, glass of the glass substrate SBG is removed (FIG. 6D). As a method of removing glass, it may be possible to adopt a method which uses glass polishing and etching using hydrogen fluoride or the like in combination. Glass may not be completely removed and a thin glass film may be formed. To be more specific, for example, an etching method may be adjusted so that a glass thin film remains. A method of removing glass is not limited to the above-mentioned method, and a glass substrate may be peeled off using any suitable method. Further, to prevent the background film UL or the like from being broken at the time of performing the removal of glass or the adhesion described later, other substrate not shown in the drawing may be preliminarily adhered to an upper surface of the TFT array substrate in a state shown in FIG. 6C. Hereinafter, such substrate is referred to as provisional transfer substrate. A material used for adhesion may desirably be a material having property by which the material loses adhesiveness by heat or light. This is because that with the use of such a material, by applying heat or light to the provisional transfer substrate after adhering the background films UL and the circuits which include the switching elements SW to the resin substrate SBF described later, the provisional transfer substrate can be peeled off.

The resin substrate SBF having flexibility is adhered to lower surfaces of the background films UL and the above-mentioned circuits in a state shown in FIG. 6D thus completing the TFT array substrate shown in FIG. 2 to FIG. 5. Thereafter, the display device having flexibility is manufactured by way of steps including a step of adhering the TFT array substrate and the color filter substrate formed of a resin substrate having flexibility in the same manner as the TFT array substrate.

In the above-mentioned manufacturing method, the step carried out at the relatively high temperature for forming the background films UL, the thin film transistors and lines above the background films UL, and the step carried out at a relatively low temperature for forming the gate connection lines GCL, the video signal connection lines DCL and the like in regions where the background films UL are not formed are clearly separated from each other. Accordingly, after the former step carried out at a high temperature is finished, the gate connection lines GCL and the video signal connection lines DCL can be formed using an organic conductive material having high flexibility but low heat resistance. These two connection lines can be simultaneously formed thus also simplifying the steps.

Figure 7:
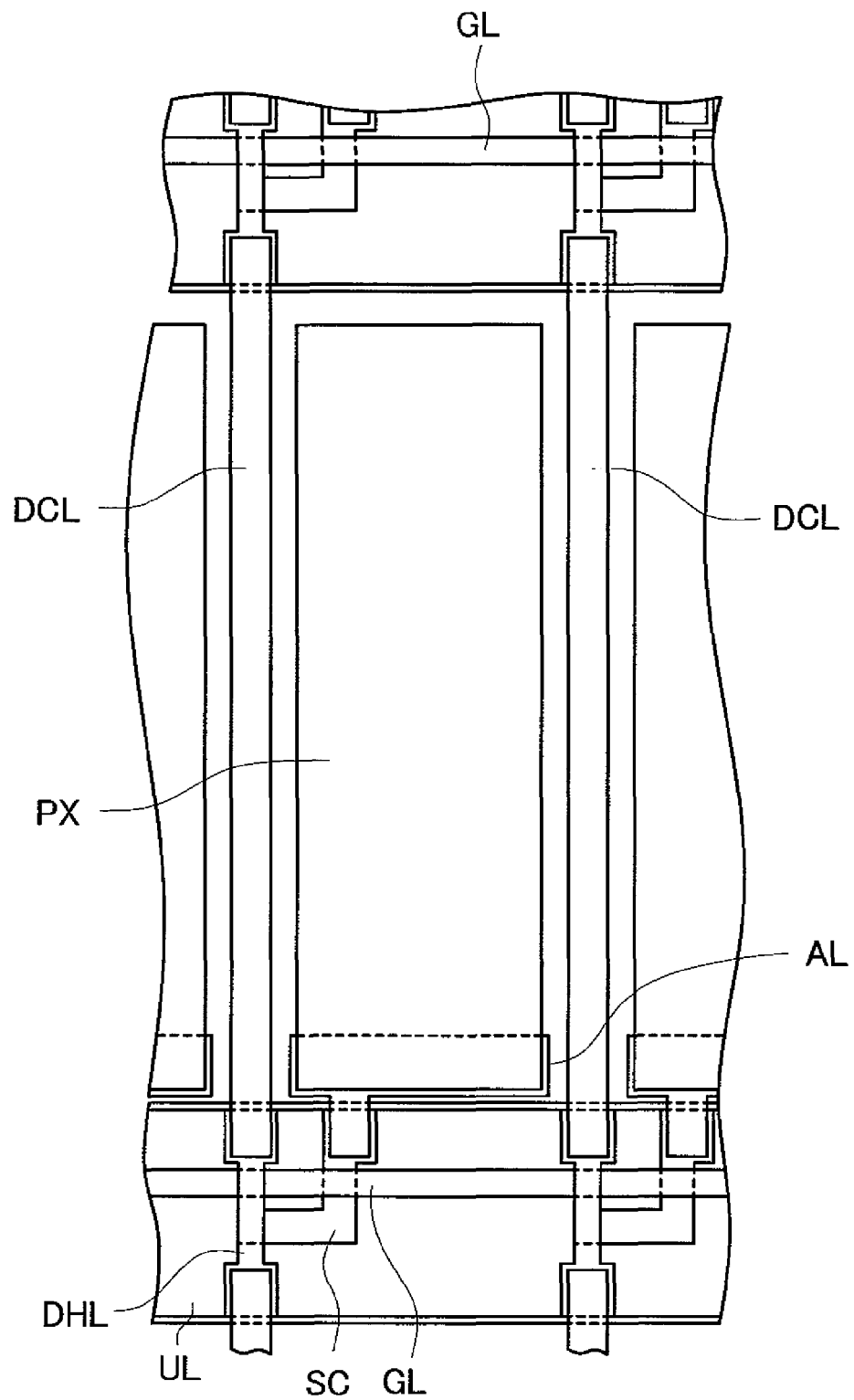
FIG. 7 is a partial plan view showing another example of the TFT array substrate according to the embodiment.

FIG. 7 is a partial plan view showing another example of the TFT array substrate according to this embodiment. FIG. 7 corresponds to FIG. 2 which shows the example explained heretofore. In this example, different from the example shown in FIG. 2, a background film UL is formed such that the background film UL extends in a strip shape in the lateral direction, or one background film UL is formed along a row of pixel circuits in the lateral direction. That is, one background film UL is formed for every gate signal line GL. Hereinafter, the explanation of this example is made by focusing on such structure.

The rectangular pixel electrode PX is arranged in the vicinity of a center portion of the drawing. The pixel electrode PX having the same shape is arranged also on left and light sides of such a pixel electrode PX respectively with a fixed distance therebetween. Although not shown in the drawing, the pixel electrode PX having the same shape is arranged also on upper and lower sides of such a pixel electrode PX with a fixed distance therebetween. One strip-shaped background film UL is provided on a lower side of the pixel electrode PX arranged at the center portion of the drawing corresponding to one row of pixel electrodes PX in the lateral direction. In the same manner, a strip-shaped background film UL is also provided on an upper side of the pixel electrode PX arranged at the center portion of the drawing. A video signal connection line DCL extends straightly in the vertical direction between the pixel electrode PX arranged at the center portion of the drawing and the pixel electrode PX arranged on a left side of such a pixel electrode PX until the video signal connection line DCL reaches the background film UL. In the same manner, a video signal connection line DCL extends in the vertical direction in a region sandwiched between the pixel electrode PX arranged at the center portion of the drawing and the pixel electrode PX arranged on a right side of such a pixel electrode PX.

The structure of the background film UL and a circuit formed on the background film UL is explained hereinafter. On the upper edge portion of the background film UL, two terminals are arranged for one pixel electrode PX, wherein the left terminal is connected to one of the above-mentioned video signal connection lines DCL, and the right terminal is connected to a metal film AL. The metal film AL is formed so as to overlap with a lower edge portion of the pixel electrode PX in plane in the drawing, and is connected to the pixel electrode PX via a contact hole not shown in the drawing. Here, the left terminal constitutes an upper end portion of the video signal line DHL which extends in the vertical direction on the background film UL. A lower end portion of the video signal line DHL also constitutes a terminal and is connected to another video signal connection line DCL. A gate signal line GL extends in the lateral direction slightly above the center of the background film UL.

The right terminal arranged on an upper edge portion of the background film UL constitutes a portion of a semiconductor film SC. The semiconductor film SC extends in a strip shape. The semiconductor film SC extends downwardly from the right terminal, intersects with the gate signal line GL below the gate signal line GL and, thereafter, is bent in the left direction in the drawing and advances straightly. Then, the semiconductor film SC is directed upwardly below the video signal line DHL, advances straightly in such a manner that the semiconductor film SC overlaps with a video signal line DHL in plane, intersects with the gate signal line GHL below the gate signal line GHL, and extends to an upper edge portion of the background film UL. The semiconductor film SC has an upper end portion thereof connected to an electrode of the video signal line DHL.

The example shown in FIG. 7 is particularly advantageous when the resolution of a screen of a display device is high. This is because when the resolution of the screen is increased, it is difficult for the constitution shown in FIG. 2 to ensure a sufficient distance between the background films UL. Also in the previously-mentioned example, it is possible to form the strip-shaped background film UL extending in a certain direction as shown in FIG. 7 (the lateral direction in the drawing in this example), and the flexibility can be increased provided that the bending direction of the display device is in the longitudinal direction in the drawing. Further, by determining the direction of long sides or short sides of a sub pixel in conformity with the bending direction, it is possible to provide a display device which exhibits flexibility in the necessary direction.

Although the embodiment of the present invention has been explained heretofore, the present invention is not limited to the above-explained embodiment. For example, the present invention is also applicable to an IPS (In Plane Switching)-type liquid crystal display device without causing any problem. This is because common electrode can be formed using the same material for forming pixel electrodes so that flexibility of the display device is not influenced by the materials. Further, the present invention is also applicable to an organic EL display device. This is because although the number of switching elements per one sub pixel differs between the display device of the embodiment and the organic EL display device, there may be a case where the organic EL display device also forms background films and uses a transfer technique.

What is claimed is:

1. A display device comprising:
   a substrate;
   a plurality of pixels which are mounted on the substrate, each pixel including a pixel electrode; and
   switching elements which are mounted on the substrate, each switching element being connected to the pixel electrode, wherein
   the substrate includes:
   a flexible insulation substrate; and
   a first insulation layer which is formed over the insulation substrate and includes a plurality of insulation films which are spaced apart from each other and which do not overlap each other in plan view;
   wherein the switching element is formed on one surface of any one of the respective insulation films, the one surface of the respective insulation film being opposite to another surface of the respective insulation film facing the flexible insulation substrate.

2. A display device according to claim 1, wherein said each insulation film contains silicon nitride or silicon oxide.

3. A display device according to claim 1, wherein the switching element is a thin film transistor.

4. A display device according to claim 1, wherein said each insulation film is formed corresponding to said each switching element.

5. A display device according to claim 1, wherein the plurality of switching elements are formed on at least one insulation film.

6. A display device according to claim 1, wherein the pixels and the switching elements are arranged in a matrix array, and the plurality of switching elements which are arranged in a row in the predetermined direction are formed on at least one insulation film.

7. A display device according to claim 1, wherein side walls of said each insulation film are formed in a tapered shape which expands in the direction toward the insulation substrate.

8. A display device according to claim 1, wherein an electrode which is connected to the switching element is formed on said each insulation film, and
   a line which is connected to the electrode is arranged between the plurality of insulation films.

9. A display device according to claim 8, wherein the line is formed of an organic conductive film.

10. A display device according to claim 8, wherein the line is formed of a thin metal film.

11. A display device according to claim 8, wherein an organic leveling film is formed below the line.

12. A manufacturing method of a display device comprising the steps of:
    forming an insulation layer on a glass substrate;
    forming a plurality of insulation films which are spaced apart from each other by patterning the insulation layer;
    forming a plurality of switching elements which are respectively formed on any one of the respective insulation films;
    removing or thinning the glass substrate; and
    adhering the insulation layer and the switching elements to an insulation substrate having flexibility.

13. A display device according to claim 3, wherein a gate insulation film of the thin film transistor is formed on and in physical contact with the one surface of the respective insulation film.

\* \* \* \* \*